United States Patent [19]

Kelley et al.

[11] 4,384,276
[45] May 17, 1983

[54] CAPACITIVE DAC TO FILTER INTERFACE CIRCUIT

[75] Inventors: Stephen H. Kelley; Richard W. Ulmer, both of Austin, Tex.

[73] Assignee: Motorola, Inc., Schaumburg, Ill.

[21] Appl. No.: 261,850

[22] Filed: May 8, 1981

[51] Int. Cl.³ .............................................. H03K 13/02
[52] U.S. Cl. ........................... 340/347 DA; 340/347 C
[58] Field of Search ............... 340/347 DA, 347 AD, 340/347 C; 375/26, 34

[56] References Cited

U.S. PATENT DOCUMENTS 4,129,863 12/1978 Gray ........................... 340/347 AD
4,200,863 4/1980 Hodges ........................ 340/347 DA

OTHER PUBLICATIONS

Haque "IEEE Journal of Solid State Circuits" vol. SC-14, No. 6, Dec. 1979, pp. 961-969.
Caves "IEEE Journal of Solid State Circuits" vol. SC-14, No. 1, Feb. 1979, pp. 65-73.

Primary Examiner—C. D. Miller
Attorney, Agent, or Firm—Anthony J. Sarli, Jr.; Jeffrey Van Myers; Robert L. King

[57] ABSTRACT

An operational amplifier capable of selectively performing a variety of circuit functions is provided. A single operational amplifier utilizes switched capacitors for sampling and holding an input signal, for establishing a low frequency pole, for applying the sample to an output capacitance to charge the capacitance and for comparing the input signal with a reference. The multifunction circuit provides a large savings in circuit area and permits versatility of circuit applications. One embodiment of the invention is to utilize a companding DAC having a capacitor array which may be used as the output capacitance of the operational amplifier circuit. The DAC provided utilizes an R ladder DAC coupled directly to a C DAC and has a switching structure that is simpler than comparable prior art circuits. The DAC is asynchronous and has programmable A- and Mu-255 law PCM conversion capability. Coupled directly to the C DAC is an operational amplifier receive filter circuit which utilizes the C DAC as an input capacitor thereby eliminating the need for a buffer amplifier and allowing the DAC to be used for both analog to digital and digital to analog conversion.

4 Claims, 3 Drawing Figures

CAPACITIVE DAC TO FILTER INTERFACE CIRCUIT

CROSS REFERENCE TO RELATED APPLICATIONS

Related subject matter can be found in the following copending applications, each of which is assigned to the assignee hereof:

1. Application Ser. No. 261,848, entitled "A MULTIPLE FUNCTION OPERATIONAL AMPLIFIER CIRCUIT", filed simultaneously herewith by Robert Noble Allgood, Stephen Harlow Kelley, Richard Walter Ulmer and Henry Wurzburg.

2. Application Ser. No. 261,852, entitled "DIGITAL TO ANALOG CONVERTER", filed simultaneously herewith by Robert Noble Allgood and Stephen Harlow Kelley.

BACKGROUND OF THE INVENTION

1. Field of the Invention

This invention relates generally to interface circuits and more particularly to a capacitive digital to analog converter (DAC) to filter interface circuit.

2. Description of the Prior Art

Capacitive digital to analog converters (DACs) are commonly used in pulse code modulation (PCM) to decode voice signals. In general, such decoded voice signals are coupled via an output buffer amplifier to an interpolation or receive filter, as shown in FIG. 10 of an article by J. T. Caves, C. H. Chan, S. D. Rosenbaum, L. P. Sellars, and J. B. Terry entitled "A PCM Voice Codec with On-Chip Filters", in the IEEE *Journal of Solid State Circuits,* February, 1979, pp. 65-73. The output buffer amplifier has been considered necessary in order to convert the charge developed on the output of the DAC to a voltage on the input stage of the filter. Typically, the input of the buffer amplifier is coupled to the output of the DAC via a coupling capacitor. A disadvantage with such circuits is that unavoidable stray capacitance associated at the nodal connection of the DAC and the coupling capacitor causes the buffer amplifier to produce an erroneous output voltage. In the Caves article cited above, it was pointed out that the DAC could theoretically be connected directly to the output buffer amplifier thereby eliminating the nodal connection and its associated error. However, because most capacitive DACs have a large amount of output capacitance, the feedback capacitor required to prevent overloading of the operational amplifier would be so large as to be impractical. In addition to consuming power and integrated circuit space, the presence of the buffer amplifier limits the use of the DAC to digital to analog conversions only.

SUMMARY OF THE INVENTION

An object of the present invention is to provide an interface circuit for coupling a capacitive DAC to a filter.

Another object of this invention is to provide a new and improved capacitive DAC to filter interface circuit which selectively couples the charge of the DAC directly to the filter thereby eliminating the need for an intermediate buffer amplifier.

Yet another object of this invention is to provide a capacitive DAC to filter interface circuit which utilizes fewer components and less integrated circuit die area than similar circuits of the prior art.

According to a preferred form of this invention, there is provided a capacitive DAC having an output for selectively coupling a charge via switching means to an input amplififer of a filter. The capacitive DAC is utilized as the input capacitor of the filter amplifier thereby eliminating a buffer amplifier. The charge on the DAC varies in an amount which is proportional to a voltage representing a digital signal. In the preferred embodiment, the DAC's charge is provided by an array of capacitors, some of which are switched to a first reference and the remainder of which are unswitched.

The above and other objects, features and advantages of the present invention will be more clearly understood from the following detailed description taken in conjunction with the accompanying drawings.

DESCRIPTION OF THE PREFERRED EMBODIMENT

Figure 1:
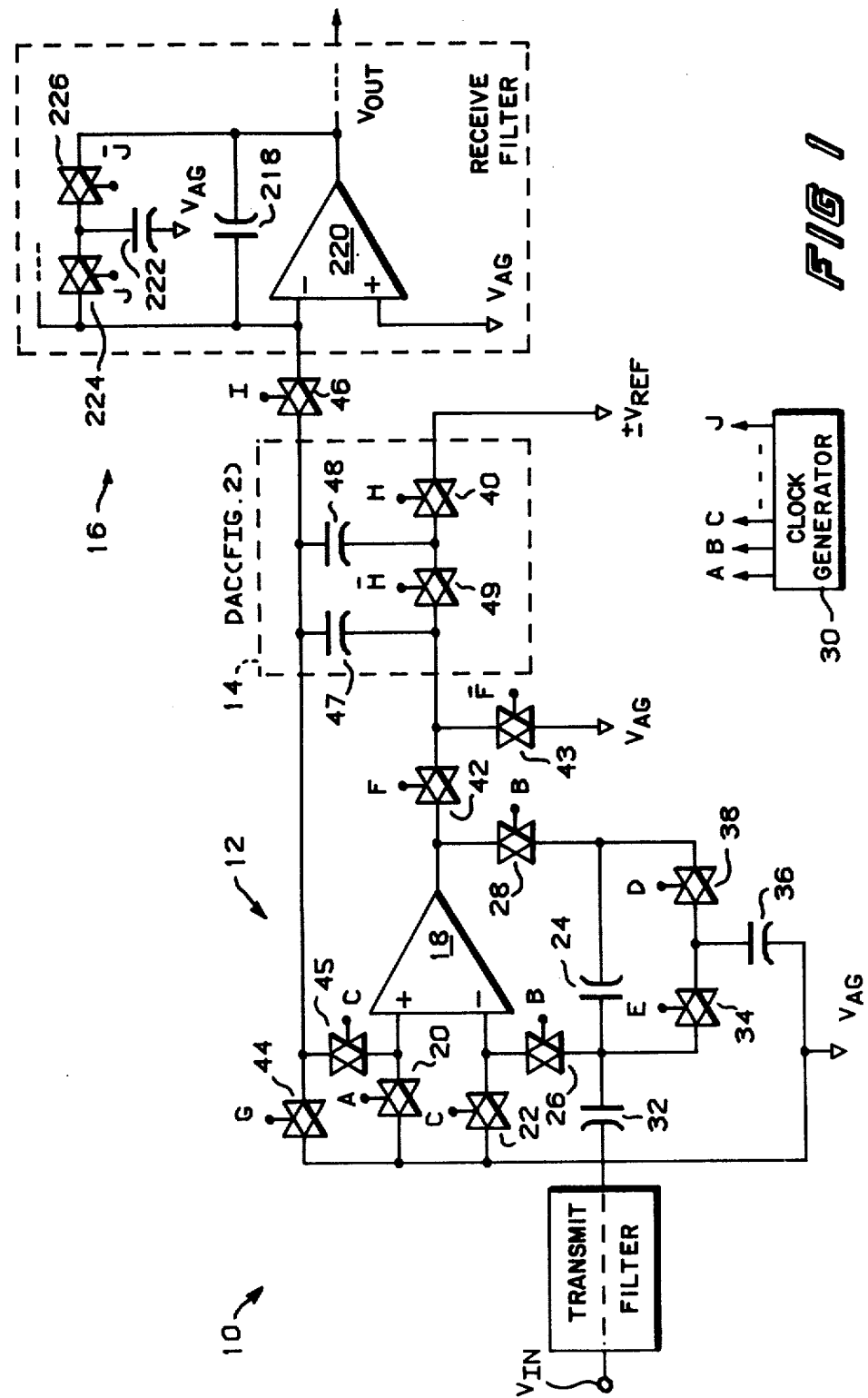
FIG. 1 is a schematic diagram illustrating one preferred embodiment of the invention.

Shown in FIG. 1, is a combined filter and coder/decoder (codec) circuit 10 constructed in accordance with the preferred embodiment of this invention. The filter-codec circuit 10 is comprised generally of a switched capacitor multiple function operational amplifier portion 12, a ladder switched capacitive digital to analog converter (DAC) portion 14, and a receive filter portion 16 which interfaces with the DAC portion 14. The circuit 10 is capable of receiving and storing an analog signal, $V_{IN}$, while simultaneously filtering the signal. The signal $V_{IN}$ may be transferred to the DAC portion 14 and converted to a digital output by utilizing the operational amplifier portion 12 as a comparator. An analog to digital (A/D) conversion may be interrupted at any time and the DAC portion 14 discharged and utilized to perform a digital to analog (D/A) conversion. After a D/A conversion has been made, the A/D conversion may be resumed. Thus the circuit 10 is particularly useful for PCM voice encoding and decoding because the two functions may be asynchronous.

In the preferred form, operational amplifier portion 12 has an operational amplifier 18 with its non-inverting and inverting inputs connected to a reference voltage, say analog ground $V_{AG}$, via switches 20 and 22, respectively. A first plate of feedback capacitor 24 is connected to the inverting input of the operational amplifier 18 via a switch 26 and a second plate of the capacitor 24 is connected to the output of the operational amplifier 18 via a switch 28. An input capacitor 32 provides AC coupling of an input signal $V_{IN}$ to the inverting input of the operational amplifier 18 via the switch 26 and the passband gain K of the operational amplifier portion 12 is approximately equal to the ratio of capacitors 32 and 24.

In the preferred embodiment, all the switches are conventional CMOS transmission gates which are constructed to be enabled or closed when a clock signal, applied to the control inputs thereof by a clock generator 30, is in a high state, and disabled or open when the clock signal is in a low state. Thus, for example, when the switch 20 is enabled by signal A, switches 26 and 28 are enabled by signal B, and switch 22 is disabled by signal C, the operational amplifier portion 12 is connected to sample the input signal $V_{IN}$ onto the feedback capacitor 24.

A switch 34 connects the first plate of feedback capacitor 24 to a first plate of a switched capacitor 36, and a switch 38 connects the second plate of the feedback capacitor 24 to the first plate of the switched capacitor 36. The second plate of the switched capacitor 36 is connected to the reference $V_{AG}$. The switches 34 and 38 are controlled by signals E and D, respectively, and alternately switch the capacitor 36 from the inverting input to the output of the operational amplifier 18. The value of the capacitor 36 determines, in part, the location of a high pass pole of the operational amplifier portion 12 of the circuit 10, permitting the filtering of the input signal $V_{IN}$ while it is being sampled onto the feedback capacitor 24.

In the preferred embodiment, the DAC portion 14 has a first input terminal which is selectively coupled to a first reference voltage, $\pm V_{ref}$, via a switch 40; a second input terminal which is selectively coupled to the output of the operational amplifier portion 12 or a second reference voltage, $V_{AG}$, via switches 42 and 43, respectively; and an output terminal selectively coupled to the second reference voltage, $V_{AG}$, the non-inverting input of the operational amplifier 18 or the input of the receive filter portion 16 via switches 44, 45 and 46, respectively. In general, the DAC portion 14 can be represented as an unswitched capacitor 47 and a switched capacitor 48. In the illustrated form, the first plates of the capacitors 47 and 48 may be selectively coupled via a DAC switch 49 to form the effective first plate of the DAC portion 14, while the second plates thereof are coupled together to form the second plate of the DAC portion 14.

Figure 3:
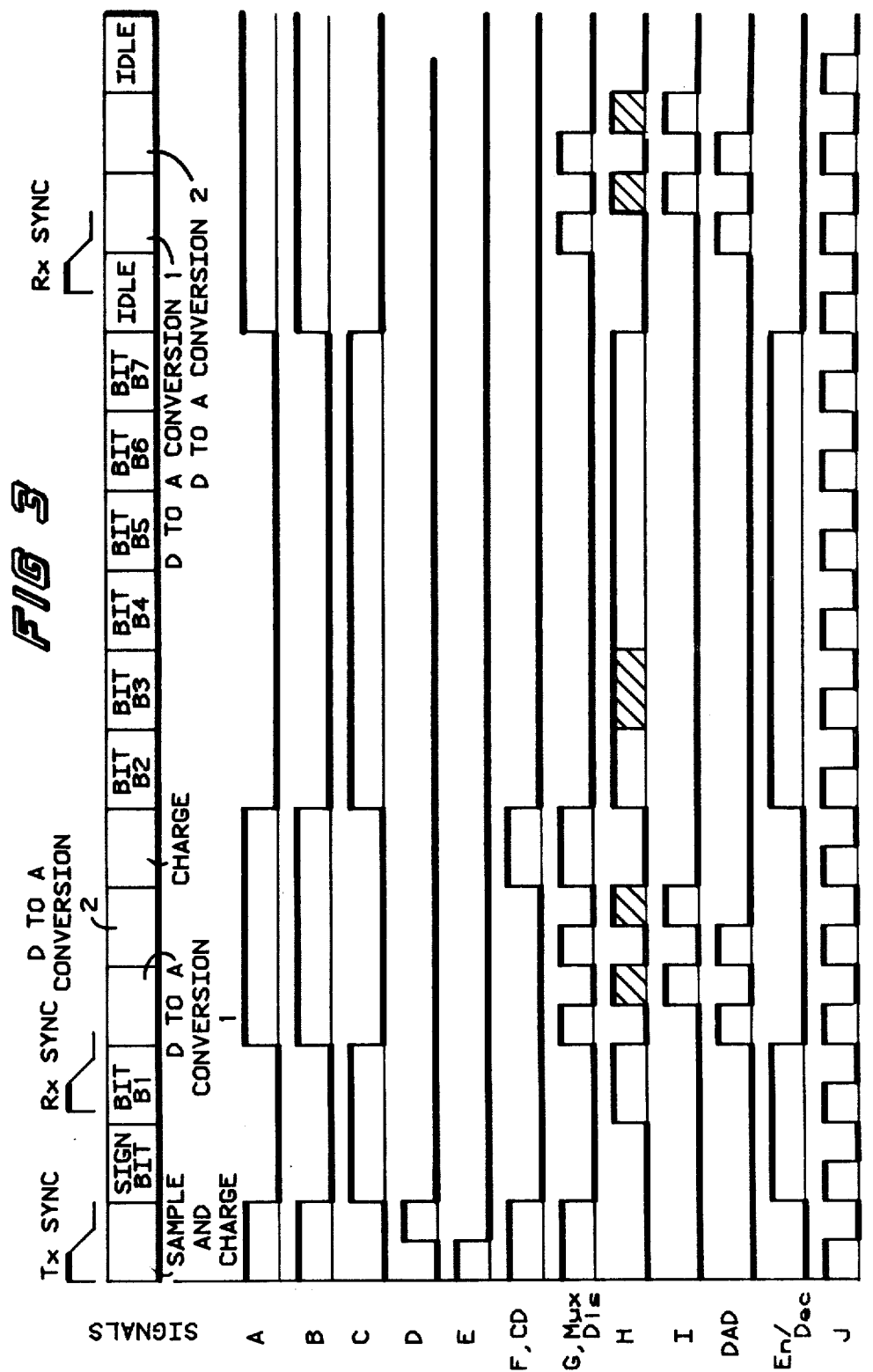
FIG. 3 is a graphic timing diagram for the schematic embodiment shown in FIGS. 1 and 2.

In operation, switches 40, 42, 43, 44, 45, 46 and 49 are controlled by signals H, F, $\overline{F}$, G, C, I and $\overline{H}$, respectively. For example, the input, sample $KV_{IN}$ can be transferred onto the DAC portion 14 as it is being sampled onto the feedback capacitor 24, if, as shown in FIG. 3, the signals F and G are simultaneously in the high state and the signal H is in the low state. Thus, another function of the operational amplifier portion 12 is to charge the DAC portion 14 to the input sample $KV_{IN}$ preparatory to converting the analog input signal into a digital signal. If it may be necessary for the DAC portion 14 to be charged from the feedback capacitor 24 relatively long after a sample is placed thereon, switches 26 and 28 should be compensated switches to isolate the charged capacitor 24 and prevent parasitic leakage paths from leaking part of the samples charge off of the feedback capacitor 24. In addition, it should be recognized that the offset voltage of the operational amplifier 18 will be charged onto the DAC portion 14 along with the input signal sample.

When the switch 22 is enabled by signal C, the operational amplifier 18 may be reconfigured as a comparator for use in an A/D conversion. For example, if switches 43 and 45 are enabled via signals $\overline{F}$ and C, respectively, while switches 42 and 44 are disabled via signals F and G, respectively, then the voltage transferred onto DAC portion 14 by the operational amplifier portion 12 will be translated relative to the second reference voltage $V_{AG}$. Of course, the stored offset voltage will also be translated by the switching action, but will now appear as an error of opposite polarity. By switching the inverting input of the operational amplifier 18 from the feedback capacitor 24 to the second reference voltage $V_{AG}$ and the non-inverting input from the second reference $V_{AG}$ to the output terminal of the DAC portion 14, the operational amplifier 18 will be connected as a comparator and will provide an output indicative of the difference between the voltages on the inputs thereof. Note that the offset voltage stored on the DAC portion 14 is now present as a bias on the non-inverting input of the operational amplifier so that the offset voltage of the operational amplifier 18 will be automatically cancelled.

If, before an A/D conversion has been completed, it is desired to perform a D/A conversion, the DAC portion 14 can be discharged and used to perform the D/A conversion. For example, switches 42 and 44 may be enabled by signals F and G, respectively, to discharge the DAC 14. Thereafter, switches 40 and 49 may be enabled by signals H and $\overline{H}$, respectively, to charge the DAC portion 14 to a percentage of the first reference $\pm V_{ref}$ representing the analog equivalent of a digital input which is being converted. After the D/A conversion is completed, the input sample $KV_{IN}$ may again be charged onto the DAC portion 14 as previously detailed and the A/D conversion restarted where it was interrupted.

In the illustrated embodiment, one operational amplifier 18 has been used for a variety of circuit functions. In the preferred embodiment, the operational amplifier portion 12 may be conveniently fabricated as a monolithic integrated circuit which requires no external components to perform each of the described circuit functions.

Figure 2:
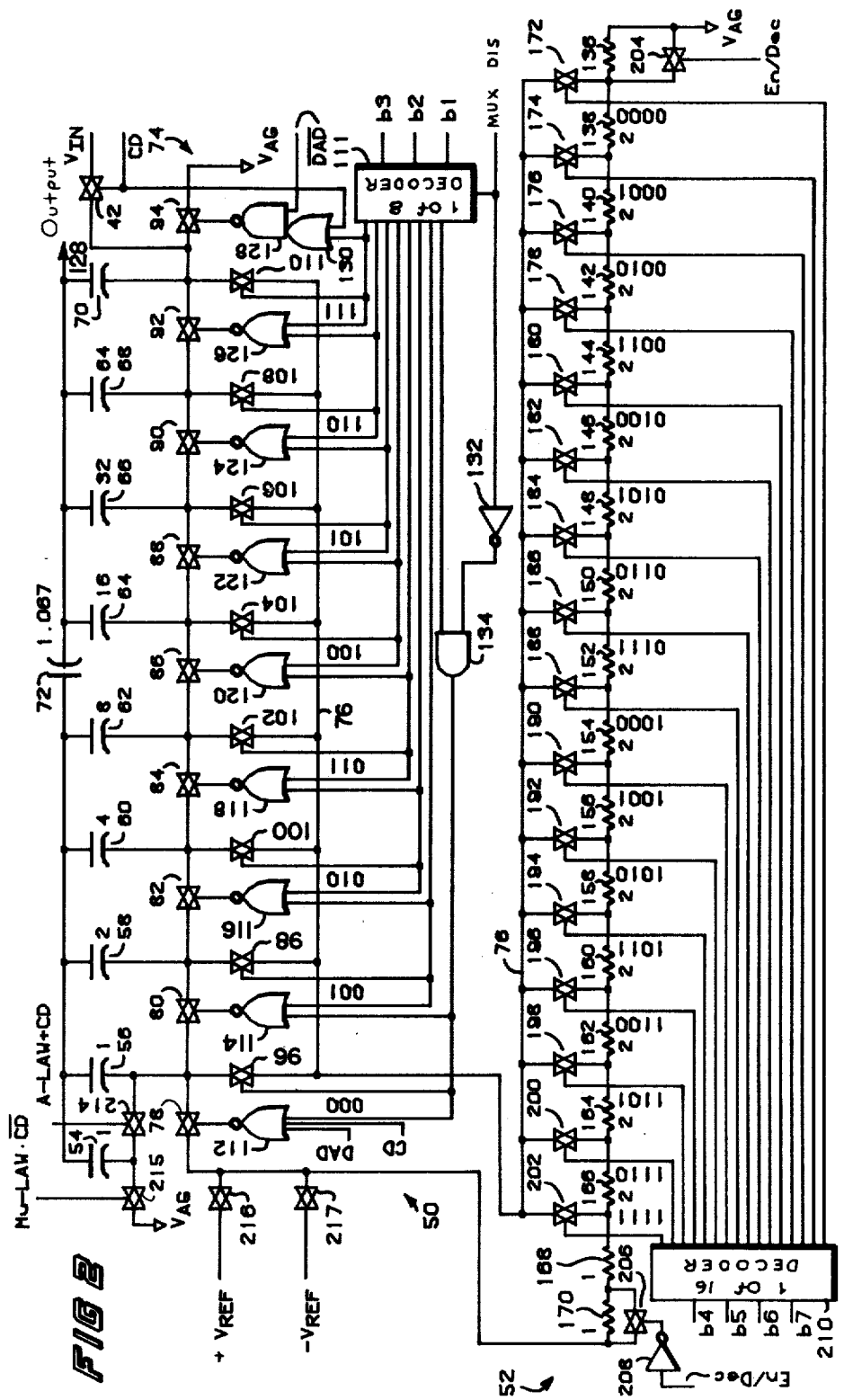
FIG. 2 is a schematic diagram illustrating one preferred embodiment of the digital to analog converter.

Shown in FIG. 2 is a preferred form of the DAC portion 14 of FIG. 1. In the illustrated form, the DAC portion 14 is comprised of two DAC sections, a capacitive or C DAC section 50 and a resistive or R DAC section 52. DACs of this form are commonly called stacked DACS and find frequent application in pulse code modulation (PCM) to make use of companding (compression/expansion) which permits an 8-bit binary code to cover a greater dynamic range than otherwise possible. Two internationally known companded codes are the Mu-255 compression law and the segmented A-law. In both laws, samples of an analog speech signal are mapped using an 8-bit PCM code into sixteen chords, with each chord comprising sixteen equal steps. In the Mu-255 law, the step intervals in each chord precisely double in size away from the origin of the input-output curve. The same is also true for the A-law, except that the first two chords on each side of the origin have the same step size. Both laws contain 256 quantization levels which are bounded by 255 decision levels. The format of the 8-bit companded PCM word is for the first bit to indicate the sign of the voice signal, the second through fourth bits are chord bits which, with the sign bit, indicate which one of the sixteen chords the signal is in, and the fifth through eighth bits are step bits which indicate which one of the sixteen steps the signal corresponds to.

In the illustrated embodiment, the C DAC section 50 includes a unit capacitor 54 and eight rank ordered capacitors 56 through 70 which are effectively binarily weighted by the ratio $2^n$, where n equals 0–7 for capacitors 56–70, respectively. The capacitors 54–70 each have a first and a second plate, with the second plates being coupled to the output terminal of the DAC portion 14.

In the illustrated embodiment, a dividing capacitor 72 is interposed between the second plates of capacitors 54-62 and the second plates of capacitors 64-70, to reduce the physical size of the capacitors 64-70 relative to capacitors 54-62 and eliminate problems associated with large ratios which tend to be imprecise. Stated another way, the dividing capacitor 72 is used to divide the effective value of the capacitors 54-62 as seen by the capacitors 64-70. Thus, although the weighted value of each capacitor is as shown in FIG. 2, the actual unit values of the capacitors 54-70 are, in the preferred form, respectively 1, 1, 2, 4, 8, 1, 2, 4 and 8. However, the capacitors 54-62 contribute a total unit value of only 1 at the output due to the dividing capacitor 72, while the capacitors 64-70 contribute a total unit value of 15 units at the output. It should be noted that the embodiment shown is only exemplary and other values may be substituted. In order to make the impedance of the capacitors 54-62 in series with capacitor 72 equal to 1 unit at the output terminal of the DAC portion 14 and allow the capacitors 54-62 to have unit weights totaling 16, the weighted value of the capacitor 72 is found by solving the following for X, the weighted value:

$$1/16 + 1/X = 1$$

$$\text{or, } X = 16/15 = 1.067 \text{ unit}$$

The capacitive DAC section 50 also includes a C ladder switching network 74 for selectively coupling the first plates of the capacitors 54-70 to the first reference voltage $\pm V_{ref}$, the second reference voltage $V_{AG}$, or a step voltage developed by the R DAC section 52 on a common rail 76. In the preferred form, the C ladder switching network 74 comprises C rail switches 78 through 94, with the switch 78 being connected between the first reference voltage $\pm V_{ref}$ and the first plate of the capacitor 54, and the switch 94 being connected between the second reference voltage $V_{AG}$ and the first plate of the capacitor 68. The switches 80 through 92 are connected between the first plates of respective, successively ordered pairs of the capacitors 56-70. The C ladder switching network 74 further includes C rung switches 96-110, coupled between the first plates of the capacitors 56-70, respectively, and the common rail 76. Each of the C rail switches 78-94 and the C rung switches 96-110 has a rank order corresponding to the rank of the associated capacitors 56-70.

The C ladder switching network 74 is controlled by a C logic circuit which includes a one-of-eight, C decoder 111 having digital inputs b1, b2, and b3 which receive corresponding chord input code bits of the PCM word, and eight rank ordered C rung outputs, each of which provides a C rung enable signal to a respective one of the ranked C rung switches 96-110. For example, the C rung output corresponding to a chord input code of 000 is connected to the C rung switch 96. Thus, for any one particular chord input code, a respective one of the C rung enable signals will be provided to enable the associated one of the C rung switches 96-110, and all the other C rung switches 96-110 will be disabled.

The C logic circuit also includes rank ordered gates 112 through 128 which provide C rail disable signals to selectively disable respective C rail switches 78-94. In the illustrated form, the gates 114-126 are two-input NOR gates which have the inputs thereof coupled to respective adjacent pairs of the C rung outputs beginning from the lowest rank (chord input codes 000 and 001) to the highest rank (chord input codes 110 and 111). Gate 112 is a three-input NOR which has a first input thereof coupled to the lowest ranked C rung output (chord input code 000), a second input thereof coupled to a Charge DAC or CD disable signal for selectively decoupling the first plates of the capacitors 54-70 from the first and second reference voltages, and a third input thereof coupled to a D/A Discharge or DAD disable signal for selectively discharging the DAC capacitors 54-70 in preparation for a digital to analog conversion. The gate 128 is a two-input NAND having a first input thereof coupled to the inverse of the DAD disable signal and the second input thereof coupled to the output of a gate 130. The gate 130 is preferably a two-input OR having a first input thereof coupled to the highest ordered C rung output (chord input code 111) and a second input thereof coupled to the CD disable signal.

In this configuration, the C rail disable outputs from the gates 112-128 determine which of the first plates of the capacitors 56-70 are connected to one another and to the reference voltages $\pm V_{ref}$ and $V_{AG}$. Assuming that the CD disable signal is in a high state, the gate 112 disables the C rail switch 78 to decouple the first plates of the capacitors 56-70 from the first reference voltage, $\pm V_{ref}$, and the gates 128 and 130 cooperate to disable the C rail switch 94 to decouple the first plates of the capacitors 56-70 from the second reference voltage $V_{AG}$. If, as shown in FIG. 3, the CD disable signal is also coupled to the control input of the switch 42 as signal F, switch 42 will then couple the input signal sample onto the first plates of the capacitors 56-70. On the other hand if the DAD disable signal is in the high state, the gate 112 disables C rail switch 78 to decouple the first plates of the capacitors 56-70 from the first reference voltage $\pm V_{ref}$, and gate 128 enables C rail switch 94 to couple the first plates of the capacitors 56-70 to the second reference voltage $V_{AG}$.

In the illustrated embodiment, the C decoder 111 may be selectively disabled via a Mux disable signal whenever it is necessary to charge or discharge the capacitors 54-70. In the preferred embodiment, the C decoder 111 will respond to a Mux disable signal in the high state by providing an enable signal on the lowest C rung output only. Simultaneously, an inverter 132 disables a gate 134 interposed in the lowest C rung output between the gates 112 and 114 and switch 96, and the C decoder 111, to prevent the enable signal from otherwise enabling the C rung switch 96. Preferably, the gate 134 is a two-input AND having a first input connected to the lowest ranked C rung output and a second input connected to the output of the inverter 132, the input of the latter being coupled to receive the Mux disable signal.

In the illustrated embodiment, the R DAC section 52 includes a voltage divider for developing on each of a rank ordered plurality of step nodes a step voltage between the first reference voltage $\pm V_{ref}$ and the second reference voltage $V_{AG}$. In the preferred form, the voltage divider comprises a plurality of resistors 136 through 170 connected in series between the first reference voltage $\pm V_{ref}$ and the second reference voltage $V_{AG}$, with the resistors 136, 168 and 170 having a relative value of one unit each and the resistors 138 through 166 having a relative value of two units each. In this configuration, predetermined step voltages having absolute values spaced between $\pm V_{ref}$ and $V_{AG}$ are developed on the step nodes between each pair of resistors 136–170.

The R DAC section 52 also includes an R ladder switching network for coupling a selected one of the step nodes to the common rail 76. In particular, a plurality of rank ordered R rung switches 172 through 202 couple respective step nodes to the common rail 76. In the preferred form, switches 204 and 206 are coupled in parallel with resistors 136 and 170, respectively, to selectively short one of the resistors 136 and 170 in response to an Encode/Decode or En/Dec signal for reasons made clear hereinafter.

The R ladder switching network is controlled by a one-of-sixteen, R decoder 210 having digital inputs b4, b5, b6 and b7 corresponding to the step input code bits of the PCM word, and sixteen R rung outputs for providing enable signals to respective R rung switches 172 through 202. For example, the R rung output corresponding to a step input code of 0000 is connected to the R rung switch 172, and the R rung output corresponding to a step input code of 1111 is connected to the R rung switch 202. Thus for any one particular step input code, a respective one of the R rung enable signals will be provided to enable the associated one of the R rung switches 172–202. In response to the R rung enable signal, the particular R rung switch 172–202 will couple a respective step node to the common rail 76. Thus, each step voltage developed across the R DAC section 52 may be selectively connected to the C DAC section 50 via the common rail 76.

To obtain a programmable A- and Mu-255 law capability, the DAC portion 14 utilizes the coding capacitor 54 which has a first plate connected to a first code switch 214. The first code switch 214 couples the first plate of the coding capacitor 54 to the first plate of the lowest ranked capacitor 56. A second plate of the coding capacitor 54 is connected to the second plate of the capacitor 56. A second code switch 215 is connected between the second reference voltage $V_{AG}$ and the first plate of the coding capacitor 54. The first code switch 214 is enabled when either an A-law PCM conversion signal or a CD enable signal is applied to its control input terminal in a high state. The second code switch 215 is enabled whenever both a Mu-law PCM conversion signal and the complement of the CD enable signal are applied in a high state to its control input terminal. Whenever the first code switch 214 is enabled, the second code switch 215 is disabled and the DAC portion 48 provides A-law PCM conversion. Thus, the coding capacitor 54 is always connected in parallel with the capacitor 56 when the C DAC section 50 is being charged. When A-law conversion is desired, the capacitor 54 is allowed to remain in parallel with the capacitor 56, so that the combination of the capacitors 54 and 56 provides a capacitance of two units. However, when Mu-255 law conversion is desired, the first plate of the Mu-255 law coding capacitor 54 is connected to the second reference voltage $V_{AG}$ and disconnected from the first plate of the capacitor 56. This removes one unit of capacitance from the C DAC section 50 to provide one-half the A-law chord size in chord 000. Thus, the step size at the origin is one-half as large in Mu-law as the step size at the origin in A-law.

Since the polarity of the input sample $KV_{IN}$ may be above or below the second reference voltage $V_{AG}$, the DAC portion 14 must be able to compare the sample on the C DAC 50 to both the positive and the negative forms of the first reference voltage $\pm V_{ref}$. In the preferred embodiment, reference voltage generators (not shown) generate the required first reference voltages $+V_{ref}$ and $-V_{ref}$. As shown in FIG. 2, the appropriate one of the positive and negative first reference voltages may be selectively coupled to the C DAC 50 and R DAC 52 via switches 216 and 217, respectively, as described hereinafter.

Referring again to FIG. 1, the first stage of the receive filter portion 16 comprises an operational amplifier 220, a feedback capacitor 218, and a switched capacitor 222 having a first plate connected to the reference $V_{AG}$ and a second plate which is alternately connected to the non-inverting input of the operational amplifier 220, via a switch 224, and the output of the operational amplifier 220, via a switch 226, in response to a control signal J and the inverse thereof, to simulate a feedback resistance. In the preferred embodiment, the receive filter portion 16 includes additional filter stages with appropriate feedback paths (not shown) for performing the desired filter functions. By selectively coupling the charge of the DAC portion 14 directly to the input of the receive filter 16 via switch 46, the need for an intermediate buffer amplifier is totally eliminated. In this configuration, parasitic capacitance errors normally associated with the use of a buffer amplifier to couple the output of the DAC portion 14 to the receive filter portion 16 are eliminated since the output terminal of the DAC portion 14 will always settle to the second reference voltage $V_{AG}$. The elimination of the buffer amplifier also conserves power and circuit area.

The international standard sampling rate for PCM voice encoding is 8 kHz or one frame every 125 usec. In the preferred embodiment, each frame is divided into sixteen equal conversion segments, and is synchronized to a Tx Sync signal. To illustrate the cooperation of the operational amplifier portion 12 and the DAC portion 14, reference will now be made to FIG. 3 which illustrates one frame in which two D/A conversions are asynchronously performed in the course of one A/D conversion. Of course, the example shown in FIG. 3 is representative of only one of many ways the circuit 10 is capable of performing.

In general, an A/D conversion is performed by sampling the analog input signal $V_{IN}$, and storing an input sample $-KV_{IN}$ onto the feedback capacitor 24. The input sample is then transferred onto the first plates of the capacitors 54–70 of the DAC portion 14, and translated onto the second plates thereof to reinvert the sample. The polarity of the translated sample is then determined relative to the second reference voltage $V_{AG}$. A binary search is then performed, using a conventional successive approximation register or SAR (not shown), to converge to the digital code which, when converted using the DAC portion 14, will effectively cancel the sample charge on the second plates of the capacitors 54–70, and force the voltage on the output terminal of the DAC portion 14 to the second reference voltage $V_{AG}$. Recall that when the DAC portion 14 is being charged to the input sample voltage, the switch 214 is enabled and the switch 215 is disabled, adding the one unit of capacitance of the capacitor 54 to the 255 units of capacitance of the capacitors 56–70 for a total C DAC 50 capacitance of 256 units. Since the R DAC 52 is capable of applying any one of the sixteen step voltages to any one of the capacitors 54–70 via the step node 76, the DAC portion 14 effectively divides the voltage difference between the first reference voltage $\pm V_{ref}$ and the second reference voltage $V_{AG}$ into 256(units of capacitance)×16(step voltages) or 4096 segments. However, the DAC portion 14 is actually able to generate only 8(chords)×16(steps) or 128 of these segments, due to the increasing step and chord size inherent in companding.

In the process of encoding, the analog input sample is compared against a set of decision levels corresponding to the segments the DAC portion 14 can generate with the R DAC 52 configured to provide step voltages which are multiples of the first reference voltage $V_{ref}/16$. In the preferred embodiment, the R DAC 52 is so configured by the En/Dec signal, which enables switch 204 and disables switch 206. However, it is well known that this technique of encoding results in a quantizing error in the range of 0 to $-1$.

In the example shown in FIG. 3, it will be assumed that the DAC portion 14 is operating according to the Mu-255 companding law. In this mode, the first plate of capacitor 54 is coupled via switch 215 to the second reference voltage $V_{AG}$ during the conversion, so that only 255 units of capacitance can be switched to each of the 16 step voltages for a total of only 4080 segments. Thus, the effective range of the DAC portion 14 is limited to $(4080/4096) \times \pm V_{ref}$.

During the first segment, the analog input signal $V_{IN}$ is sampled, and the instantaneous value stored on the feedback capacitor 24 is $-KV_{IN}$, where $-K$ is the gain of the operational amplifier 18. For the purposes of this explanation, it will be assumed that the input sample $-KV_{IN}$, stored on the feedback capacitor 24, has a value of $-340/4096$ of the first reference voltage $+V_{ref}$. Simultaneously, the input sample is transferred to the first plates of the capacitors 54–70 of the C DAC circuit 50 via the gate 42 which is enabled by the signal CD. After the input sample has been stored on the C DAC 50, the sample is translated relative to the second reference voltage $V_{AG}$ by coupling the second plates of capacitors 54–70 to the non-inverting input of operational amplifier 18 and the first plates of capacitors 54–70 to the second reference voltage $V_{AG}$. The polarity of the sample can now be determined by configuring the operational amplifier 18 as a comparator to compare the translated sample to the second reference voltage $V_{AG}$. For the example given, the output of the operational amplifier 18 will be positive, indicating that the input sample $KV_{IN}$ was positive when sampled. The result of the comparison is then stored as a positive sign bit in the SAR, and used to select the negative one of the first reference voltages $\pm V_{ref}$ by disabling switch 216 and enabling switch 217.

During the second segment, the SAR forces the next most significant bit or b1 to a 1, making a mid-range chord input code 100 to the C decoder 111 and the low-range step input code 0000 to the R decoder 210. In response to the chord input code of 100, the C decoder 111 and gates 112–130 disable switches 86 and 88, and enable switches 78–84 and 90–94, to couple the first plates of capacitors 56–62 to the first reference voltage $-V_{ref}$ and the first plates of capacitors 66–70 to the second reference voltage $V_{AG}$. The C decoder 111 and gates 112–130 also disable switches 96–102 and 106–110, and enable switch 104 to couple the first plate of capacitor 64 to the step node 76. In response to the step input code of 0000, the R decoder 210 disables switches 174–202 and enables switch 172, to couple the step node 76 to the second reference voltage $V_{AG}$. The resulting sharing on the second plates of the capacitors 54–70 of the charge representing the stored sample, develops a voltage on the second plates of the capacitors 54–70, and the voltage is applied to the non-inverting input of the operational amplifier 18, which is still in the comparator configuration.

Since the charge due to the switching of the first plates of capacitors 56–62 to the first reference voltage $-V_{ref}$ is not sufficient to cancel all of the sample charge on the second plates of all of the capacitors 54–70, the voltage on the second plates will still be above the second reference voltage $V_{AG}$. The output of the operational amplifier 18 will therefore be positive, resulting in a code of 1 being stored in the b1 position of the SAR.

In the hypothetical example shown, an Rx Sync signal is received during the third segment, indicating that the A/D conversion sequence must be interrupted to perform a D/A conversion. Thus, during the fourth segment, the DAC capacitors 54–70 are initially discharged, since the input sample $-KV_{IN}$ is still being held on the feedback capacitor 24. Assume, for example, that a digital input code 00101100 has been received. Since the sign bit b0 is 0, the desired analog output signal must be negative. If the receive filter portion 16 has an odd number of inversion stages therein, as in the preferred embodiment, then the positive one of the first reference voltages $+V_{ref}$ must be selected by enabling switch 216 and disabling switch 217. After discharge, the C decoder 111 responds to the chord input code of 010 by enabling switches 78–80, 86–94 and 100, and disabling switches 82 and 84. Simultaneously, the R decoder 210 responds to the step input code of 1100 by enabling switch 196 and disabling 172–194 and 198–202. Thus, the first plates of capacitors 56 and 58 are coupled to the first reference voltage $+V_{ref}$, the first plate of capacitor 60 is coupled to the step node 76, and the first plates of capacitors 62–70 and 54 are coupled to the second reference voltage $V_{AG}$. For the example given, the step voltage developed by the R DAC 52 on step node 76 will be $(25/32) \times V_{ref}$. The charge on the output terminal of the DAC portion 14 resulting from the selective switching of the first plates of the capacitors 56–60 is coupled to the receive filter portion 16 via switch 46 under control of control signal I. It can be shown, using charge redistribution principles, that this charge is proportional to $[(98/4096) \times (+V_{ref})]$, with the proportionality constant being related to the Thevinin equivalent total capacitance of the array of capacitors 54–70 as seen from the output terminal of the DAC portion 14.

In the preferred embodiment, the capacitors 54–70 function as the input capacitance of the first stage of the receive filter portion 16, and determine in part the gain of this stage. In order to reduce the gain required of the first stage of the receive filter portion 16 while increasing the dynamic range of the filter portion 16, the D/A conversion is performed twice in consecutive segments in order to couple a sufficient amount of charge into the receive filter portion 16. An unexpected advantage accruing from interfacing the DAC portion 14 to the receive filter portion 16 in this manner is the automatic correction of the (sin x)/x distortion normally associated with flat-top or zero order hold sampling of an analog signal. For a more detailed description of this problem, reference may be made to U.S. Pat. No. 4,320,519, filed April 10, 1980 by Stephen H. Kelley and Henry Wurzburg and assigned to the assignee of the present invention now U.S. Pat. No. 4,320,519.

It is possible to minimize the quantizing error resulting from the original A/D conversion, by performing a half bit correction during the D/A conversion. To accomplish the correction, the R DAC 52 should be configured to provide the step voltages as odd multiples of the second reference voltage $V_{AG}/32$. In the preferred embodiment, the R DAC 52 is so configured by the En/Dec signal which enables switch 206 and disables switch 204. The correction effectively raises or upshifts the R ladder by one-half LSB in a digital to analog conversion, to compensate for the relative lowering or downshifting of the R ladder by one-half LSB in an analog to digital conversion, resulting in a shifting of the quantizing error to the range of $\pm\frac{1}{2}$.

By the end of the fifth segment, the converted analog signal has been coupled into the receive filter 16 and charged onto the filter feedback capacitor 218. At the start of the sixth period, the analog to digital conversion is resumed where it was interrupted, by charging the input sample $-KV_{IN}$ back onto the DAC capacitors 54-70 from the feedback capacitor 24. At the end of the sixth segment, the input signal sample is again translated onto the second plates of capacitors 54-70, as described above.

During the seventh segment, the SAR, which has remained at the value established by the end of the second segment, forces the next most significant digital input bit b2, i.e the second chord input bit, to 1. In response to the resulting chord input code of 110, the C decoder 111 and gates 112-130 disable switches 90 and 92, and enable switches 78-88 and 94, to couple the first plates of capacitors 56-66 to the first reference voltage $-V_{ref}$ and the first plate of capacitor 70 to the second reference voltage $V_{AG}$. The C decoder 111 and gates 112-130 also disable switches 96-106 and 110, and enable switch 108, to couple the first plate of capacitor 68 to the step node 76. In response to the step input code of 0000, the R decoder 210 disables switches 174-202 and enables switch 172 and 204, to couple the step node 76 to the second reference voltage $V_{AG}$. The resulting sharing on the second plates of the capacitors 54-70 of the charge representing the stored sample, develops a voltage on the second plates of the capacitors 54-70, which is applied to the non-inverting input of the operational amplifier 18, the latter being still in the comparator configuration.

Since the charge due to the switching of the first plates of capacitors 56-66 to the first reference voltage $-V_{ref}$ is now more than sufficient to cancel all of the sample charge on the second plates of all of the capacitors 54-70, the voltage on the second plates will be below the second reference voltage $V_{AG}$. The output of the operational amplifier 18 will therefore be negative, resulting in a code of 0 being stored in the b2 position of the SAR.

During the eighth segment, the SAR forces the next most significant digital input bit b3, i.e the third chord input bit, to a 1. In response to the resulting chord input code of 101, the C decoder 111 and gates 112-130 disable switches 88 and 90, and enable switches 78-86 and 92-94, to couple the first plates of capacitors 56-64 to the first reference voltage $-V_{ref}$ and the first plate of capacitors 68-70 to the second reference voltage $V_{AG}$. The C decoder 111 and gates 112-130 also disable switches 96-104 and 108-110, and enable switch 106, to couple the first plate of capacitor 66 to the step node 76. In response to the step input code of 0000, the R decoder 210 disables switches 174-202 and enables switch 172 and 204, to couple the step node 76 to the second reference voltage $V_{AG}$. The resulting sharing on the second plates of the capacitors 54-70 of the charge representing the stored sample, develops a voltage on the second plates of the capacitors 54-70, which is applied to the non-inverting input of the operational amplifier 18, the latter being still in the comparator configuration.

Since the charge due to the switching of the first plates of capacitors 56-64 to the first reference voltage $-V_{ref}$ is still more than sufficient to cancel all of the sample charge on the second plates of all of the capacitors 54-70, the voltage on the second plates will again be below the second reference voltage $V_{AG}$. The output of the operational amplifier 18 will therefore be negative, resulting in a code of 0 being stored in the b3 position of the SAR. Thus, by the end of the eighth segment, the chord input portion of the SAR contains 100, indicating that the amplitude of the input signal sample is within chord 4.

During the ninth segment, the SAR forces the next most significant digital input bit b4, i.e the first step input bit, to a 1. In response to the chord input code of 100, the C decoder 111 and gates 112-130 disable switches 86-88, and enable switches 78-84 and 90-94, to couple the first plates of capacitors 56-62 to the first reference voltage $-V_{ref}$ and the first plate of capacitors 66-70 to the second reference voltage $V_{AG}$. The C decoder 111 and gates 112-130 also disable switches 96-102 and 106-110, and enable switch 104, to couple the first plate of capacitor 64 to the step node 76. In response to the step input code of 1000, the R decoder 210 disables switches 172-186 and 190-192, and enables switch 188, to couple $(16/32)xV_{ref}$ to the first plate of capacitor 64 via step node 76. The resulting sharing on the second plates of the capacitors 54-70 of the charge representing the stored sample, develops a voltage on the second plates of the capacitors 54-70, which is applied to the non-inverting input of the operational amplifier 18, the latter being still in the comparator configuration.

Since the charge due to the switching of the first plates of capacitors 56-62 to the first reference voltage $-V_{ref}$ and the first plate of the capacitor 64 to $(16/32)xV_{ref}$ is still more than sufficient to cancel all of the sample charge on the second plates of all of the capacitors 54-70, the voltage on the second plates will again be below the second reference voltage $V_{AG}$. The output of the operational amplifier 18 will therefore be negative, resulting in a code of 0 being stored in the b4 position of the SAR. In a similar manner, each of the remaining digital input bits b5, b6 and b7, corresponding to the remaining step input bits are determined in the tenth, eleventh and twelfth segments, respectively. Thus, by the end of the twelfth segment, the chord input portion of the SAR contains 100 and the step input portion of the SAR contains 0110, indicating that the amplitude of the input signal $V_{IN}$, when sampled, was within step 6 of chord 4.

Any time after the A/D conversion has been completed, the contents of the SAR can be transferred into an appropriate holding register (not shown) for subsequent use or transmission. In the preferred embodiment, the transfer is accomplished during the segment following determination of digital code bit b7. The SAR is then cleared to all zeros so as to be ready for the next A/D conversion cycle.

During the thirteenth segment, a second Rx Sync signal is received. In response, the circuit 10 operates as described above to perform the requested digital to analog conversion during the fourteenth and fifteenth segments. When neither an analog to digital or a digital to analog conversion is occurring, the circuit may enter an idle mode, as in the thirteenth and sixteenth segments. Depending upon the relative timing of the Tx and Rx Sync signals, each frame may have from 0 to 4 idle mode segments.

Although the operation of the circuit 10 has been illustrating using the exemplary timing diagram of FIG. 3, it will be clear that the ability of the circuit 10 to perform two D/A conversions and one A/D conversion during a single frame assures asynchronous operation in voice applications. In fact, it can be shown that the circuit 10 will perform satisfactorily even if the Tx Sync signal occurs a few segments early, provided that the previous A/D conversion has been completed.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention

We claim:

1. In combination:

capacitive DAC means for capacitively coupling a charge to an output portion thereof in proportion to a voltage coupled to an input portion thereof;

input switching means for coupling the input portion of the capacitive DAC means to a first reference voltage in response to a first enable signal;

filter means for providing an output signal on an output portion thereof at a voltage related to the charge coupled to an input portion thereof;

output switching means for coupling the output portion of the capacitive DAC means to the input portion of the filter means in response to a second enable signal, and to a second reference voltage in response to a third enable signal, and clock generator means for sequentially providing the third enable signal during a discharge period, the second enable signal during a settling period, the first and second enable signals during a sample period, and the first enable signal during a hold period.

2. The combination of claim 1 wherein the capacitive DAC means comprise:

unswitched capacitance means having an input portion coupled to the second reference voltage, and an output portion coupled to the output portion of the capacitive DAC means;

switched capacitance means having an input portion coupled to the input switching means, and an output portion coupled to the output portion of the capactive DAC means; and DAC switching means for coupling the input portion of the switched capacitance means to the second reference voltage in response to the third enable signal.

3. The combination of claims 1 or 2 wherein the filter means comprise:

operational amplifier means having inverting and non-inverting inputs and an output;

feedback capacitance means coupled between the inverting input and the output of the operational amplifier; and feedback resistance means coupled between the inverting input and the output of the operational amplifier.

4. A method of decoding an encoded signal, comprising the steps of:

charging said encoded signal onto capacitance means of a D/A converter to provide a charge related to said encoded signal; and coupling said charge directly to a filter which uses said capacitance means as an input capacitor, thereby eliminating the need to convert said charge to a voltage before said encoded signal is filtered.

* * * * *